United States Patent
Han et al.

(10) Patent No.: US 10,288,951 B2
(45) Date of Patent: May 14, 2019

(54) LIQUID CRYSTAL DISPLAY PANEL AND MANUFACTURING METHOD THEREOF

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Shuai Han, Beijing (CN); Chunlei Wang, Beijing (CN); Junsheng Chen, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 117 days.

(21) Appl. No.: 14/422,838

(22) PCT Filed: Dec. 11, 2013

(86) PCT No.: PCT/CN2013/089085
§ 371 (c)(1),
(2) Date: Feb. 20, 2015

(87) PCT Pub. No.: WO2014/201812
PCT Pub. Date: Dec. 24, 2014

(65) Prior Publication Data
US 2015/0226991 A1    Aug. 13, 2015

(30) Foreign Application Priority Data
Jun. 20, 2013   (CN) .......................... 2013 1 0247479

(51) Int. Cl.
*H01L 27/12*   (2006.01)
*G02F 1/1335*  (2006.01)
(Continued)

(52) U.S. Cl.
CPC .......... *G02F 1/1341* (2013.01); *G02F 1/1368* (2013.01); *G02F 1/13394* (2013.01);
(Continued)

(58) Field of Classification Search
CPC ............. G02F 1/1341; G02F 1/133512; G02F 1/133514; G02F 1/13394; G02F 1/1368;
(Continued)

(56) References Cited

U.S. PATENT DOCUMENTS 4,626,073 A * 12/1986 Amstutz ............... G02F 1/1339
349/149
5,285,304 A    2/1994 Hotta et al.
(Continued)

FOREIGN PATENT DOCUMENTS

CN    1885117 A    12/2006
CN    101452156 A    6/2009
(Continued)

OTHER PUBLICATIONS

English machine translation of JP04355727A.*
(Continued)

*Primary Examiner* — Edward J Glick
*Assistant Examiner* — David Y Chung
(74) *Attorney, Agent, or Firm* — Nath, Goldberg & Meyer; Joshua B. Goldberg

(57) ABSTRACT

Embodiments of the present invention provides a liquid crystal display panel and a manufacturing method thereof, the present invention relates to the field of display technology and can eliminate vacuum bubbles so as to increase the product yield. The liquid crystal display panel comprises an array substrate and a color filter substrate which are assembled to form a cell, and a liquid crystal layer and spacers provided between the array substrate and the color filter substrate, wherein the spacer is provided with a defor-
(Continued)

mation layer therein, and the deformation layer is used to allow the spacer to be expanded in a direction perpendicular to the cell thickness direction under the action of an external condition.

3 Claims, 3 Drawing Sheets

(51) Int. Cl.
G02F 1/1339 (2006.01)
G02F 1/1341 (2006.01)
G02F 1/1368 (2006.01)
H01L 29/786 (2006.01)

(52) U.S. Cl.
CPC .. G02F 1/133512 (2013.01); G02F 1/133514 (2013.01); H01L 27/1248 (2013.01); H01L 27/1296 (2013.01); H01L 29/78633 (2013.01); G02F 2001/13398 (2013.01); G02F 2001/13415 (2013.01)

(58) Field of Classification Search
CPC . G02F 2001/13398; G02F 2001/13415; H01L 27/1248; H01L 27/1296; H01L 29/78633
USPC .................................................. 349/155, 156
See application file for complete search history.

(56) References Cited

U.S. PATENT DOCUMENTS

| | | | | |
|---|---|---|---|---|
| 6,108,068 A | * | 8/2000 | Yano | G02F 1/13334 349/155 |
| 2002/0027636 A1 | * | 3/2002 | Yamada | G02F 1/133305 349/155 |
| 2005/0099577 A1 | | 5/2005 | Lee et al. | |
| 2005/0243266 A1 | * | 11/2005 | Ryu | G02F 1/13394 349/187 |
| 2006/0170856 A1 | * | 8/2006 | Choi | G02F 1/1337 349/156 |
| 2006/0244894 A1 | * | 11/2006 | Yoon | G02F 1/13394 349/155 |
| 2016/0033803 A1 | * | 2/2016 | Zhang | G02F 1/13394 349/155 |

FOREIGN PATENT DOCUMENTS

| | | |
|---|---|---|
| CN | 103323982 A | 9/2013 |
| JP | 4-355727 A | 12/1992 |
| JP | 2005345521 A | 12/2005 |

OTHER PUBLICATIONS

Office Action issued in Chinese application No. 201310247479.4 dated Mar. 31, 2015 (Mar. 31, 2015).
International Search Report dated Dec. 11, 2013 corresponding to application No. PCT/CN2013/089085.

* cited by examiner

US 10,288,951 B2

LIQUID CRYSTAL DISPLAY PANEL AND MANUFACTURING METHOD THEREOF

This is a National Phase Application filed under 35 U.S.C. 371 as a national stage of PCT/CN2013/089085, filed Dec. 11, 2013, an application claiming the benefit of Chinese Application No. 201310247479.4, filed Jun. 20, 2013, the content of each of which is hereby incorporated by reference in its entirety.

FIELD OF THE INVENTION

The present invention relates to the field of display technology, and particular to a liquid crystal display panel and a manufacturing method thereof.

BACKGROUND OF THE INVENTION

A liquid crystal display panel mainly consists of an array substrate, a color filter substrate and a liquid crystal layer located between the array substrate and the color filter substrate. During manufacturing the liquid crystal display panel, a commonly adopted method is as follows: providing a sealant on a prepared array substrate first, then filling liquid crystal inside the sealant, and finally assembling the array substrate with the color filter substrate to form the liquid crystal display panel.

However, during manufacturing the liquid crystal display panel, the drop filling of the liquid crystal is insufficient due to the reasons such as drop volume error of the liquid crystal dropper, estimated liquid crystal volume being not enough. Thus, after the array substrate and the color filter substrate are assembled to form a cell, vacuum bubbles are generated in the cell, which will lead to a defect of display.

SUMMARY OF THE INVENTION

Embodiments of the present invention provide a liquid crystal display panel and a manufacturing method thereof, which can eliminate vacuum bubbles to increase product yield.

To achieve the above objective, the following technical solutions are adopted in the embodiments of the present invention.

As one aspect of the present invention, a liquid crystal display panel is provided, comprising an array substrate and a color filter substrate which are assembled to form a cell, and a liquid crystal layer and spacers provided between the array substrate and the color filter substrate, wherein the spacer is provided with a deformation layer therein, and the deformation layer is used to allow the spacer to be expanded in a direction perpendicular to a cell thickness direction under the action of an external condition.

As another aspect of the present invention, a manufacturing method of a liquid crystal display panel is provided, comprising steps of:

providing spacers on an array substrate and/or a color filter substrate, the spacer is provided with a deformation layer therein, and the deformation layer is used to allow the spacer to be expanded in a direction perpendicular to a cell thickness direction under the action of an external condition; and assembling the array substrate with the color filter substrate to form a cell, and filling liquid crystal material between the array substrate and the color filter substrate, so as to form a liquid crystal layer.

Embodiments of the invention provide a liquid crystal display panel and a manufacturing method thereof, the liquid crystal display panel comprises an array substrate and a color filter substrate which are assembled to form a cell, and a liquid crystal layer and spacers provided between the array substrate and the color filter substrate, wherein the spacer is provided with a deformation layer therein, and the deformation layer is used to allow the spacer to be expanded in a direction perpendicular to a cell thickness direction under the action of an external condition. Thus, when a vacuum bubble is generated in the cell of the liquid crystal display panel, it is possible to perform an excitation at a position around a part where the vacuum bubble exists, so that the deformation layer at or around the part is deformed in a direction perpendicular to the cell thickness direction, thus the spacer provided with the deformation layer therein is expanded in the direction perpendicular to the cell thickness direction, so as to fill up the vacuum bubble. As a result, a defect in the liquid crystal display panel due to the existence of vacuum bubble can be solved, and the product yield can be improved.

BRIEF DESCRIPTION OF THE DRAWINGS

In order to illustrate more clearly the technical solutions of the present invention or in the prior art, drawings required when describing the embodiments or the prior art will be briefly introduced in the following, and obviously, drawings in the following are merely used to illustrate some embodiments of the present invention and persons skilled in the art may obtain other drawings based on these drawings without any creative efforts.

REFERENCE SIGNS

10—array substrate; 101—thin film transistor; 20—color filter substrate; 201—black matrix; 30—liquid crystal layer; 40—spacer; 50—deformation layer; 501—carrier; 502—reactant; 503—product; 60—vacuum bubble.

DETAILED DESCRIPTION OF THE EMBODIMENTS

In the following descriptions, technical solutions of embodiments of the present invention will be described clearly and thoroughly in conjunction with drawings of embodiments of the present invention. Obviously, the embodiments to be described are merely part, but not all, of embodiments of the present invention. All other embodiments, obtained by persons skilled in the art based on the embodiments described in the present invention without any creative efforts, should fall within the protection scope of the present invention.

Figure 4A:
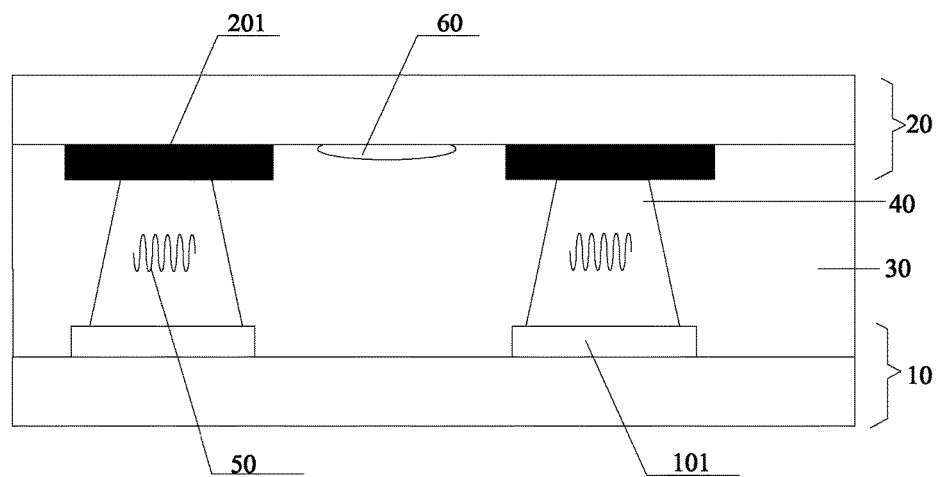
FIG. 4a is a structural diagram illustrating existence of a vacuum bubble in a liquid crystal display device comprising shape memory alloy, according to an embodiment of the present invention.

An embodiment of the invention provides a liquid crystal display panel, as shown in FIG. 4a, the liquid crystal display panel comprises an array substrate 10 and a color filter substrate 20 which are assembled to form a cell, and a liquid crystal layer 30 and spacers 40 provided between the array substrate 10 and the color filter substrate 20, wherein the spacer 40 is provided with a deformation layer 50 therein, and the deformation layer 50 is used to allow the spacer to be expanded in a direction perpendicular to a cell thickness direction under the action of an external condition.

It should be noted that, first, the material and pattern shape of the deformation layer 50 are not limited in the present invention, so long as the deformation layer 50 can allow the spacer 40 to be expanded in a direction perpendicular to a cell thickness direction under the action of an external condition; second, the external condition may be laser, microwave, temperature, luminance and the like, so long as it may cause the spacer 40 to be expanded according to the material or composition of the deformation layer 50.

An embodiment of the invention provides a liquid crystal display panel, comprising an array substrate 10 and a color filter substrate 20 which are assembled to form a cell, and a liquid crystal layer 30 and spacers 40 provided between the array substrate 10 and the color filter substrate 20. Furthermore, the liquid crystal display panel comprises a deformation layer 50 provided in the spacer 40, wherein the deformation layer 50 is used to allow the spacer 40 to be expanded in a direction perpendicular to a cell thickness direction under the action of an external condition. Thus, in this embodiment, when a vacuum bubble is generated in the cell of the liquid crystal display panel, it is possible to perform an excitation at a position around a part where the vacuum bubble exists, so that the spacer 40 provided with the deformation layer 50 therein at or around the part is expanded in a direction perpendicular to a cell thickness direction, and thus the vacuum bubble is filled up by use of the expansion of the spacer 40. As a result, a defect in the liquid crystal display panel due to the existence of vacuum bubble can be solved, and the product yield can be improved.

Preferably, the deformation layer 50 is made of shape memory alloy. The shape memory alloy may be shape memory alloy with one-way shape memory effect, for example, Cu—Zn—Ga, Cu—Zn—Sn, or the like.

Figure 1:
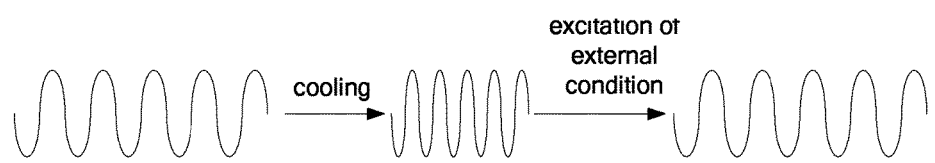
FIG. 1 is a diagram illustrating a deformation of shape memory alloy, according to an embodiment of the present invention.

The one-way shape memory effect refers to that the shape memory alloy is deformed in a relatively low temperature, and is restored to a shape before its deformation after being excited by an external condition such as heating. In the embodiment of the present invention, as the shape memory alloy is required to expand in a direction perpendicular to a cell thickness direction under the excitation by an external condition such as heating, thus in the embodiment of the present invention, when the deformation layer 50 is made of the shape memory alloy, its shape is a shape in a relatively low temperature. Specifically, for example, as shown in FIG. 1, it shows the following procedure: the shape of the deformation layer 50 (that is, the shape of the shape memory alloy) in a normal temperature state is deformed and contracted by cooling, and then is expanded by an external condition. That is to say, compared to the shape memory alloy before being deformed by cooling, the shape of the shape memory alloy after being deformed by cooling is contracted in the direction perpendicular to the cell thickness direction. Thus, in a case where the shape of the shape memory alloy forming the deformation layer 50 is the shape of the shape memory alloy after being deformed by cooling, the deformation layer 50 may be expanded in the direction perpendicular to the cell thickness direction when the deformation layer 50 is excited, for example, by light, so that the purpose of causing the spacer 40 to be expanded is achieved.

It should be noted that, the shape of the shape memory alloy before being deformed by cooling and the shape of the shape memory alloy after being deformed by cooling in FIG. 1 are merely illustrative, the shape of the shape memory alloy may be any shape capable of being manufactured, so long as the shape memory alloy after being deformed by cooling may be expanded in the direction perpendicular to the cell thickness direction by an excitation of an external condition.

Regarding the shape of the shape memory alloy of the deformation layer 50 provided in the spacer 40, for example, during manufacturing the spacer 40, a pattern of one portion of the spacer 40 may be formed first, then the shape memory alloy with a specific shape is formed on the pattern of the one portion of the spacer 40 through a transfer process, and finally, the other portion of the spacer 40 is formed.

Further preferably, the deformation layer 50 may be provided at 50%~80% height of the spacer 40.

Thus, only middle portion of the spacer 40 may be expanded in volume, whereas contact areas between the spacer 40 and the array substrate 10 and the color filter substrate 20 are not changed, thus other defects can be effectively avoided.

Figure 2:
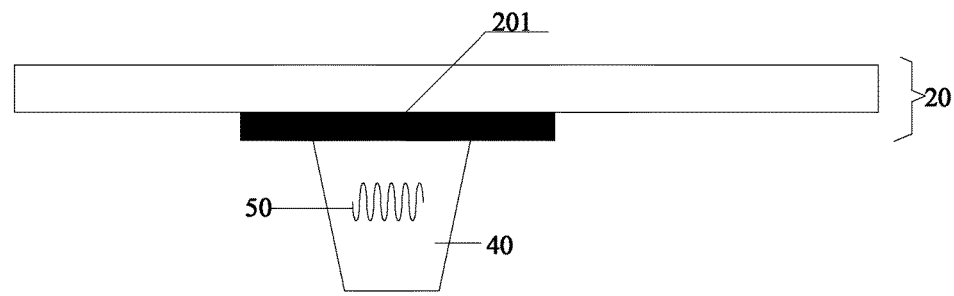
FIG. 2 is a structural diagram of a color filter substrate provided with a spacer, according to an embodiment of the present invention.

Furthermore, in an implementation where the color filter substrate 20 is provided with black matrixes, as shown in FIG. 2, the spacer 40 may be provided on the black matrix, so that the aperture ratio of the liquid crystal display panel will not be reduced.

Figure 3:
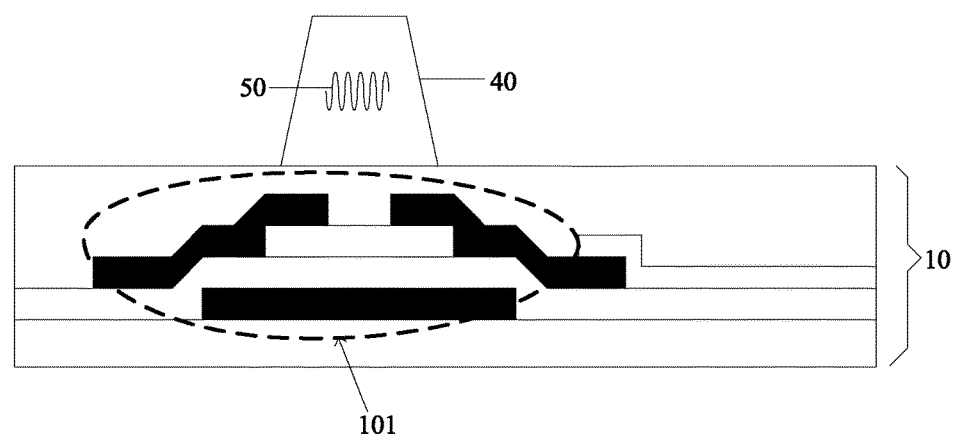
FIG. 3 is a structural diagram of an array substrate provided with a spacer, according to an embodiment of the present invention.

Preferably, as shown in FIG. 3, the spacer 40 is provided on the array substrate 10 and corresponds to a thin film transistor 101.

Preferably, a portion of the spacers 40 may be formed on the black matrixes on the color filter substrate 20, while the other portion of the spacers 40 may be formed on the array substrate 10 corresponding to thin film transistors 101.

Regarding the structure of the liquid crystal display panel, as shown in FIG. 4a, the liquid crystal display panel comprises an array substrate 10 and a color filter substrate 20 which are assembled to form a cell, and a liquid crystal layer 30 and spacers 40 provided between the array substrate 10 and the color filter substrate 20, and further comprises a deformation layer 50 provided in the spacer 40 and at 50% height of the spacer 40, the deformation layer 50 is made of shape memory alloy, wherein the array substrate 10 comprises thin film transistors 101, the spacers 40 are provided at positions, which correspond to the thin film transistors 101, on the array substrate 10.

Figure 4B:
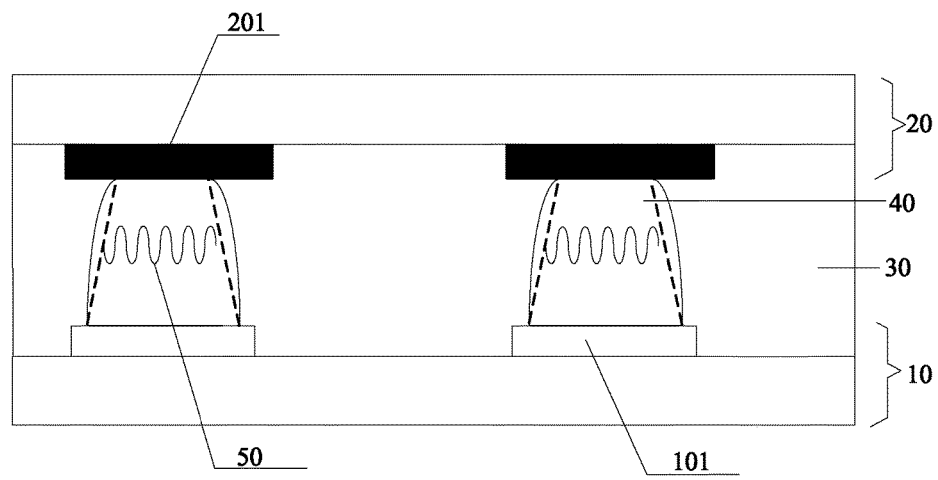
FIG. 4b is a diagram illustrating an expansion of a spacer in a direction perpendicular to a cell thickness direction in a liquid crystal display device comprising shape memory alloy, according to an embodiment of the present invention.

With reference to FIG. 4a, when a vacuum bubble 60 exists in the cell, only a spacer 40 near the vacuum bubble 60 is excited by an external condition, such as illumination of laser, so that the deformation layer 50 made of the shape memory alloy and provided in the spacer 40 is expanded in a direction perpendicular to the cell thickness direction, and thus the spacer 40 is expanded in the direction perpendicular to the cell thickness direction. As shown in FIG. 4b, as the volume of the spacer 40 is expanded, the void formed by the vacuum bubble may be filled up by the increased volume, so that a defect in the liquid crystal display panel due to the existence of the vacuum bubble can be solved.

In addition, as the deformation layer 50 is provided at 50% height of the spacer 40, only middle portion of the spacer 40 may be expanded, whereas contact areas between the spacer 40 and the array substrate 10 and the color filter substrate 20 are not changed, thus other defects can be effectively avoided.

Figure 5A:
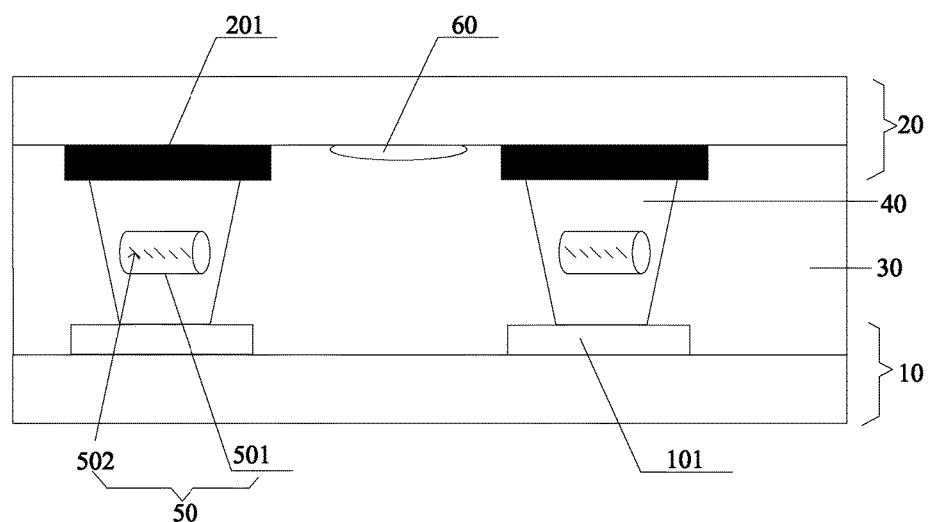
FIG. 5a is a structural diagram illustrating existence of a vacuum bubble in a liquid crystal display device comprising a hardener carrier and reactants, according to an embodiment of the present invention.
Figure 5B:
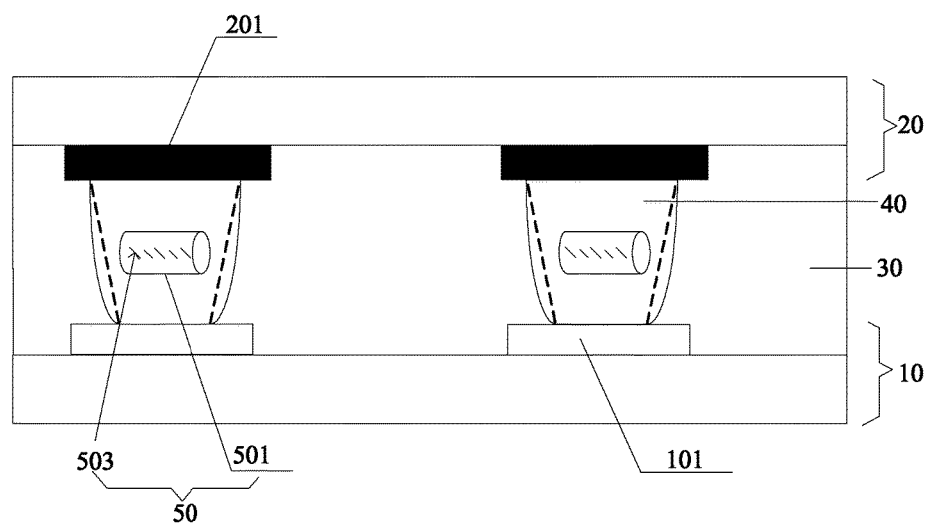
FIG. 5b is a diagram illustrating an expansion of a spacer in a direction perpendicular to a cell thickness direction in a liquid crystal display device comprising a hardener carrier and a reactant, according to an embodiment of the present invention.

As another embodiment, instead of forming the deformation layer 50 by the shape memory alloy, as shown in FIG. 5a and FIG. 5b, the deformation layer 50 may include a carrier 501 made of hardener and reactants 502 filled in the carrier 501. The reactants 502 may produce a chemical reaction to generate a product 503 under the action of an external condition, the product 503 may allow the spacer 40 to be expanded in a direction perpendicular to the cell thickness direction.

It should be noted that, reactants 502 may include a catalyst for facilitating reaction and the like, and which may be set as desired and is not limited herein. In addition, the amount of the reactants 502 and the placement manner of the carrier 501 are not limited herein, so long as the reactants 502 filled in the carrier 501 made of hardener may produce a chemical reaction to generate the product 503 under the action of an external condition, the product 503 may allow the spacer 40 to be expanded in a direction perpendicular to the cell thickness direction, and function of the spacer 40 for maintaining the cell thickness is not affected.

With reference to FIG. 5a, when a vacuum bubble 60 exists in the cell, only a spacer 40 near the vacuum bubble 60 is excited by an external condition (such as high frequency microwave oscillation, or local high temperature illumination of laser). As shown in FIG. 5b, due to the physical characteristics of the hardener, the carrier 501 may be deformed in a direction in which resistance is relatively small when a chemical reaction is produced by the reactants 502 in the carrier 501. For this reason, the carrier 501 here is provided such that its length direction is consistent with a direction perpendicular to the cell thickness direction, so that the reactants 502 produce the chemical reaction in the length direction of the carrier 501, thus the product 503 obtained from the reaction expands in the direction perpendicular to the cell thickness direction in the carrier 501 made of the hardener, which allows the spacer 40 to be expanded in the direction perpendicular to the cell thickness direction, and thus the void formed by the vacuum bubble may be filled up by the increased volume. Furthermore, a defect in the liquid crystal display panel due to the existence of the vacuum bubble can be solved.

Furthermore, preferably, the product 503 includes melamine resin, or urea resin, or polystyrene resin, or polyvinyl alcohol.

For example, under the action of a acid catalyst, the reactants of formaldehyde and 1,3,5-triazine-2,4,6-triamine produce a reaction by illumination of laser, so as to generate the melamine resin.

In this case, before the reaction is produced, as the reactants 502 are provided in the carrier 501 made of hardener so as to be insulated from outside, pollution will not be caused. After the reaction is produced, as the product 503 is similar to the commonly and currently used composition of the spacer 40, the liquid crystal is prevented from being polluted due to the introduction of impurities.

An embodiment of the invention further provides a manufacturing method of a liquid crystal display panel, comprising steps of:

providing spacers 40 on an array substrate 10 and/or a color filter substrate 20, the spacer 40 is provided with a deformation layer 50 therein, and the deformation layer 50 is used to allow the spacer 40 to be expanded in a direction perpendicular to a cell thickness direction under the action of an external condition; and assembling the array substrate 10 with the color filter substrate 20 to form the cell, and filling liquid crystal material between the array substrate 10 and the color filter substrate 20 to form a liquid crystal layer 30.

Furthermore, in an implementation where the color filter substrate 20 is provided with black matrixes, as shown in FIG. 2, the spacer 40 may be provided on the black matrix, so that the aperture ratio of the liquid crystal display panel will not be reduced.

Preferably, as shown in FIG. 3, the spacer 40 is provided on the array substrate 10 and corresponds to a thin film transistor 101.

Preferably, a portion of the spacers 40 may be formed on the black matrixes on the color filter substrate 20, while the other portion of the spacers 40 may be formed on the array substrate 10 corresponding to thin film transistors 101.

Further preferably, the deformation layer 50 may be formed at 50%~80% height of the spacer 40.

In a case where the spacer 40 is formed on the array substrate 10 and the spacer 40 is formed with the deformation layer 50 made of shape memory alloy therein, the deformation layer 50 being formed at 50%~80% height of the spacer comprises following steps.

Step S101, on the array substrate 101, forming a first spacer pattern at 50%~80% height of the spacer 40 to be formed through a patterning process.

S102, on the array substrate 10 subjected to the step S101, forming a pattern of the deformation layer 50 made of shape memory alloy on the first spacer pattern through a transfer process.

Specifically, contacting a printing plate surface having shape memory alloy particles thereon with all of the first spacer patterns, wherein there is a printing plate micropore, on the printing plate surface, at position corresponding to each first spacer pattern, wherein the sizes and number of the printing plate micropores correspond to those of the first spacer patterns and are used for providing the shape memory alloy particles. On the rear surface of the array substrate 10, an electric field between transfer electrodes charges the array substrate 10 with more charges than the printing plate, so as to attract and transfer the shape memory alloy particles on the printing plate surface to the first spacer patterns. Here, the shape of the deformation layer formed by the shape memory alloy particles may be, for example, the deformed shape in a relatively low temperature as shown in FIG. 1. Of course, other shapes are possible, so long as the deformation layer may be expanded in a direction perpendicular to the cell thickness direction under the excitation of an external condition.

S103, on the array substrate 10 subjected to the step S102, forming a second spacer pattern which has a height equal to 20%~50% height of the spacer to be formed through a patterning process, wherein the first spacer pattern and the second spacer pattern form the spacer 40.

In a case where the spacer 40 is formed on the color filter substrate 20 and the spacer 40 is formed with the deformation layer 50 made of the shape memory alloy therein, the deformation layer 50 being formed at 50%~80% height of the spacer 40 comprises following steps.

Step S201, on the color filter substrate 20, forming a first spacer pattern at 50%~80% height of the spacer 40 to be formed through a patterning process.

S202, on the color filter substrate 20 subjected to the step S201, forming a pattern of the deformation layer 50 made of shape memory alloy on the first spacer pattern through a transfer process.

S203, on the color filter substrate 20 subjected to the step S202, forming a second spacer pattern which has a height equal to 20%~50% height of the spacer to be formed through a patterning process, wherein the first spacer pattern and the second spacer pattern form the spacer 40.

Preferably, the shape memory alloy may be shape memory alloy with one-way shape memory effect, for example, Cu—Zn—Ga, Cu—Zn—Sn, or the like In a case where the spacer 40 is formed on the array substrate 10 and the spacer 40 is formed therein with a deformation layer 50 including a carrier 501 made of hardener and reactants 502 filled in the carrier 501, the deformation layer being formed at 50%~80% height of the spacer comprises following steps.

Step S301, on the array substrate 101, forming a first spacer pattern at 50%~80% height of the spacer 40 to be formed through a patterning process.

S302, on the array substrate 10 subjected to the step S301, providing the carrier 501 made of hardener and filled with the reactants 502 on the first spacer pattern, wherein the length direction of the carrier 501 is consistent with a direction perpendicular to the cell thickness direction.

Specifically, a carrier 501 having a cylindrical shape may be made by using hardener first, the reactants 502 (e.g. 1,3,5-triazine-2,4,6-triamine, formaldehyde and an acid catalyst) are placed into the carrier 501, and then the carrier 501 filled with the reactants 502 is placed on the first spacer pattern in such a manner that the axial of the carrier 501 is perpendicular to the cell thickness direction.

S303, on the array substrate 10 subjected to the step S302, forming a second spacer pattern which has a height equal to 20%~50% height of the spacer to be formed through a patterning process, wherein the first spacer pattern and the second spacer pattern form the spacer 40.

Thus, in a case where a vacuum bubble exists in a cell after the array substrate 10 and the color filter substrate 20 are assembled to form the cell, a spacer 40 near the vacuum bubble may be locally excited by an external condition, such as illumination of laser, so that the reactants 502 in the carrier 501 produce a chemical reaction to generate melamine resin. As the chemical reaction is produced in the axial direction of the carrier 501 and the axial of the carrier 501 is provided in a direction perpendicular to the cell thickness direction, the product (melamine resin) 503 extends from two ends of the carrier 501, thus the spacer 40 is expanded in the direction perpendicular to the cell thickness direction.

Similarly, in a case where the spacer 40 is formed on the color filter substrate 20 and the spacer 40 is formed therein with a deformation layer 50 including a carrier 501 made of hardener and reactants 502 filled in the carrier 501, steps for formation of the spacer is similar to the above steps S301-S303, and will not be repeated here.

The above are merely specific embodiments of the present invention, but the protection scope of the present invention is not limited thereto. Persons skilled in the art will readily conceive various modifications or substitutes within the technical range disclosed in the present invention, which should fall within the protection scope of the invention. Therefore, the protection scope of the invention should be defined by the appended claims.

The invention claimed is:

1. A manufacturing method of a liquid crystal display panel, comprising steps of:
   providing spacers on an array substrate and/or a color filter substrate, a deformation layer is provided at a central portion in the spacer, and the deformation layer allowing the spacer to be expanded in a direction perpendicular to a cell thickness direction under the action of an external condition; and
   assembling the array substrate and the color filter substrate such that the spacers are between the array layer and the color filter substrate to form the cell, and filling liquid crystal material between the array substrate and the color filter substrate to form a liquid crystal layer, wherein the spacer is configured to maintain cell thickness of the liquid crystal display panel when the deformation layer expands, wherein
   the deformation layer is formed at 50%~80% height of the spacer, which comprises:
   on the array substrate and/or the color filter substrate, forming a first spacer pattern at 50%~80% height of the spacer to be formed through a patterning process;
   forming a pattern of the deformation layer made of shape memory alloy on the first spacer pattern through a transfer process, and a second spacer pattern with a height equal to 20%~50% height of the spacer to be formed through a patterning process,
   wherein the first spacer pattern and the second spacer pattern form the spacer.

2. A manufacturing method of a liquid crystal display panel, comprising steps of:
   providing spacers on an array substrate and/or a color filter substrate, a deformation layer is provided at a central portion in the spacer, and the deformation layer allowing the spacer to be expanded in a direction perpendicular to a cell thickness direction under the action of an external condition; and
   assembling the array substrate and the color filter substrate such that the spacers are between the array layer and the color filter substrate to form the cell, and filling liquid crystal material between the array substrate and the color filter substrate to form a liquid crystal layer, wherein the spacer is configured to maintain cell thickness of the liquid crystal display panel when the deformation layer expands, wherein
   the deformation layer is formed at 50%~80% height of the spacer, which comprises:
   on the array substrate and/or the color filter substrate, forming a first spacer pattern at 50%~80% height of the spacer to be formed through a patterning process;
   providing a hardener carrier filled with reactants on the first spacer pattern, the hardener carrier filled with reactants forms the deformation layer, wherein the reactants produce a chemical reaction to generate product under an external condition, the product allows the spacer to be expanded in the direction perpendicular to the cell thickness direction;
   forming a second spacer pattern with a height equal to 20%~50% height of the spacer to be formed through a patterning process,
   wherein the first spacer pattern and the second spacer pattern form the spacer.

3. The manufacturing method of claim 1, wherein the deformation layer is made of shape memory alloy with one-way shape memory effect.

\* \* \* \* \*